United States Patent [19]

Inoue et al.

[11] Patent Number: 5,250,827
[45] Date of Patent: Oct. 5, 1993

[54] SEMICONDUCTOR INTEGRATED CIRCUIT HAVING A DRAM CELL UNIT AND A NONVOLATILE CELL UNIT

[75] Inventors: Naoto Inoue; Motoo Toyama; Hiroshi Takahashi; Masahiko Kinbara, all of Tokyo, Japan

[73] Assignee: Seiko Instruments Inc., Japan

[21] Appl. No.: 717,409

[22] Filed: Jun. 18, 1991

[30] Foreign Application Priority Data

Jun. 21, 1990 [JP] Japan ................... 2-163673
Aug. 29, 1990 [JP] Japan ................... 2-229480

[51] Int. Cl.⁵ ........................... H01L 29/68
[52] U.S. Cl. ........................... 257/295; 257/298; 365/145; 365/149
[58] Field of Search ............... 357/23.6, 41; 365/145, 365/149; 257/295, 298

[56] References Cited

U.S. PATENT DOCUMENTS

| | | | |
|---|---|---|---|
| 4,860,254 | 8/1989 | Pott et al. | 365/145 |
| 4,893,272 | 1/1990 | Eaton, Jr. et al. | 365/145 |
| 4,910,708 | 3/1990 | Eaton, Jr. et al. | 365/145 |
| 4,962,322 | 10/1990 | Chapman | 357/41 |
| 5,086,412 | 2/1992 | Jafte et al. | 365/145 |
| 5,119,154 | 6/1992 | Gnadinger | 257/298 |
| 5,155,573 | 10/1992 | Abe et al. | 257/763 |

FOREIGN PATENT DOCUMENTS 62-185376 8/1987 Japan .

Primary Examiner—Andrew J. James
Assistant Examiner—Courtney A. Bowers
Attorney, Agent, or Firm—Bruce L. Adams; Van C. Wilks

[57] ABSTRACT

A high density nonvolatilized semiconductor integrated circuit is comprised of a Dynamic RAM (DRAM) cell unit and a nonvolatile cell unit. The DRAM cell unit is comprised of a first transistor having its gate connected to a word line, its source connected to a bit line and its drain connected to a first capacitor. The first capacitor has its other electrode connected to a first line. The nonvolatile RAM cell unit is comprised of a second transistor having its gate connected to a second line, its source connected to the bit line and its drain connected to a second capacitor. The second capacitor has its other electrode connected to a third line. The second capacitor comprises a ferroelectric substance to which a reverse voltage is applied in order to read out its signal, and the first capacitor comprises a paraelectric substance to which such reverse voltage is not applied. The cycle life of the DRAM cell unit is thereby increased. Further, the composition of the integrated circuit having a smaller number of constituent elements allows high-density circuit formation.

9 Claims, 5 Drawing Sheets

5,250,827

SEMICONDUCTOR INTEGRATED CIRCUIT HAVING A DRAM CELL UNIT AND A NONVOLATILE CELL UNIT

BACKGROUND OF THE INVENTION (1) Field of the Invention

This invention relates to a semiconductor integrated circuit used for an electronic machine such as a computer, and having a Dynamic Ram (DRAM) cell unit and a nonvolatile cell unit.

(2) Description of the Related Art

The conventional memories obtained by nonvolatilizing the information stored in a volatile memory include a NVRAM (Nonvolatile RAM) consisting of as shown in FIG. 3, a SRAM (Static RAM) 30 to which floating gate type memory transistors 33a, 33b are added. Referring to the drawing, reference numerals 31a, 31b denote bit lines, and 32a, 32b denote word lines.

It is difficult to subject a SRAM to high-density integration since the area of a memory cell therein is large.

As shown in Japanese laid Open Patent Tokkosho 62-185376 (Japanese application number sho 62-17450), the conventional memories obtained by nonvolatilizing the information stored in a volatile memory include a nonvolatile DRAM consisting as shown in FIG. 4 of a DRAM to which a second capacitor is added. Referring to the drawing, reference numerals 41 denotes bit line, 42 first capacitor, 43 transistor, 44 word line, 45, 47 lines, and 46 second capacitor comprised of a ferroelectric substance.

It is difficult to subject a first capacitor to a small capacity since a large parasitic capacitance composed of a second capacitor 46 and a capacitor developed between a line 47 and ground therein is developed during operation of the DRAM.

As a result, it is difficult to subject a DRAM to high density integration since the area of a memory cell therein is large.

SUMMARY OF THE INVENTION

It is an object of the present invention to provide a semiconductor integrated circuit having a small number of constituent elements and high density integration.

In order to solve the above-mentioned problems, according to the present invention, a semiconductor integrated circuit is comprised of a first transistor having a first gate electrode, first drain electrode and first source electrode, the first transistor being connected to a bit line at either the first drain or first source electrode, a first capacitor comprising a paraelectric substance, the first capacitor having first and second electrodes wherein either the first or second electrode is connected to the first drain or first source electrode which is not connected to the bit line, a first line connected to the first or the second electrode which is not connected to the first transistor, a word line connected to the first gate electrode, a second transistor having a second gate electrode, second drain electrode and second source electrode, the second transistor being connected to the bit line at either the second source or second drain electrode, a second capacitor comprising a ferroelectric substance, the second capacitor having first and second electrodes, one of which is connected to the second source or second drain electrode of the second transistor which is not connected to the bit line, a second line connected to the second gate electrode of the second transistor, and a third line connected to the first or the second electrode of the second capacitor which is not connected to the second transistor.

According to the present invention, the information stored in a DRAM is nonvolatilized by additionally employing a capacitor consisting of a ferroelectric substance, and a transistor serving as a switch for charging and discharging this capacitor. As the increase of parastic capacitance is very small in operation of the DRAM, the area of the first capacitor in the DRAM is very small.

The semiconductor integrated circuit formed according to the present invention has a small number of constituent elements, so that it is suitably formed to a higher density.

DETAILED DESCRIPTION OF THE PREFERRED EMBODIMENTS

An embodiment of the semiconductor integrated circuit consisting of a DRAM unit and a nonvolatile cell unit according to the present invention will now be described in detail with reference to the drawings.

Figure 1:
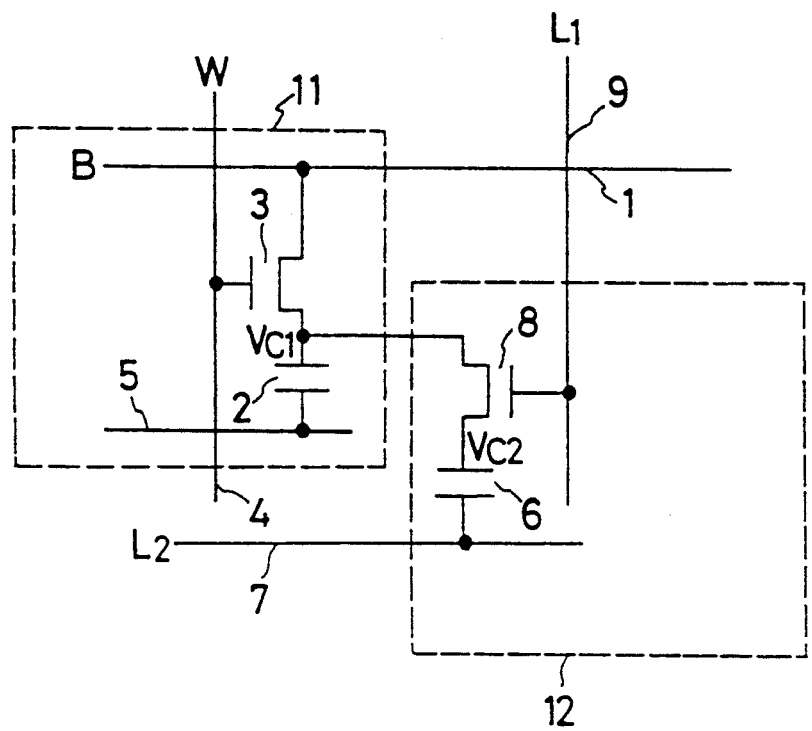
FIG. 1 is a diagram of a first embodiment of the semiconductor integrated circuit having a DRAM cell unit and a nonvolatile cell unit according to the present invention.

FIG. 1 is a diagram of one bit of the semiconductor integrated circuit according to one embodiment of the present invention using a DRAM consisting of one transistor and one capacitor. The source electrode of a transistor 3 is connected to a bit line 1, the gate electrode thereof to a word line 4, the drain electrode thereof to an upper electrode of a capacitor 2 consisting of a paraelectric substance, and a lower electrode of the capacitor 2 to a line 5. The drain electrode of the transistor 3 and the source electrode of a transistor 8 are connected together, and the drain electrode of the transistor 8 to an upper electrode of a capacitor 6 comprising of a ferroelectric substance. The gate electrode of the transistor 8 is connected to a line 9, and a lower electrode of the capacitor 6 to a line 7, the circuit being thus formed.

As ferroelectric substance has polarization-voltage hysterisis loops, nonvolatile operation results from stable polarization states which exist at the top and bottom of the loops.

Figure 5:
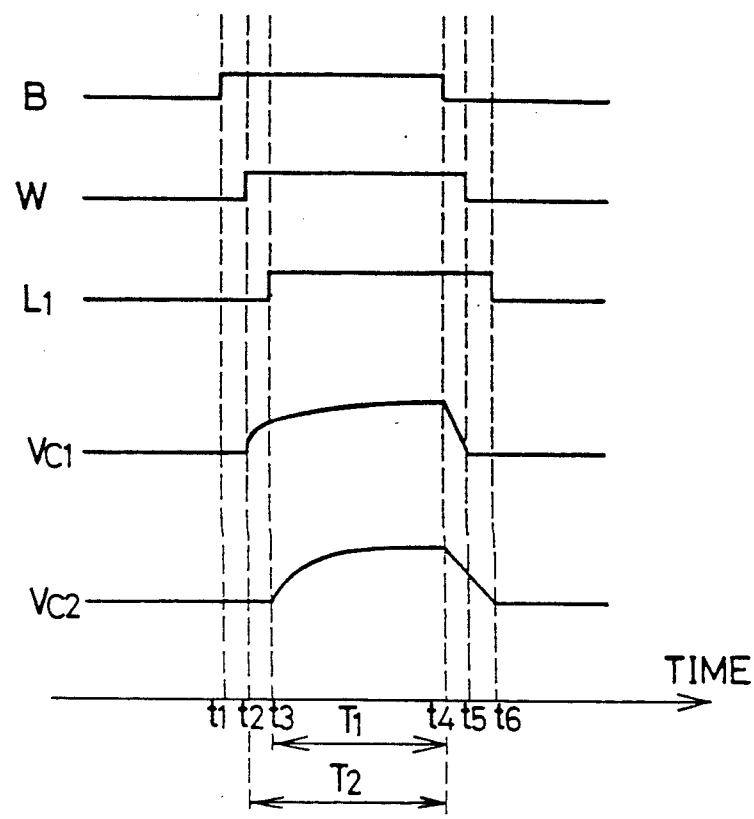
FIG. 5 is a timing chart for an operation for storing information in the DRAM cell unit and the nonvolatile cell unit shown in FIG. 1.
Figure 6:
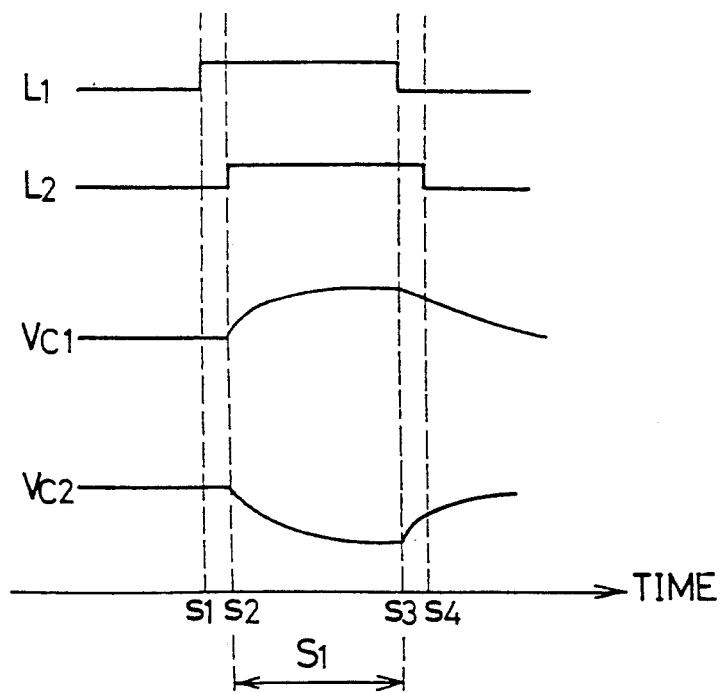
FIG. 6 is a timing chart for an operation of reading information out of the nonvolatile cell unit to the DRAM cell unit shown in FIG. 1.

Information corresponds to the top and bottom of the loops which are selected by applying voltage to the capacitor comprising a ferroelectric substance. A combination of the bit line 1, word line 4, line 5, transistor 3 and capacitor 2 will hereinafter be called a DRAM cell unit 11, and a combination of the line 9, line 7, transistor 8 and capacitor 6 will be referred to as a nonvolatile cell unit 12, for convenience's sake. When the semiconductor integrated circuit according to the present invention is used as a volatile memory, the transistor 8 is off, and the DRAM cell unit 11 and nonvolatile cell unit 12 are electrically separated from each other, so that an operation of the DRAM only is carried out. An operation for storing the information in the DRAM cell unit 11 and the nonvolatile cell unit 12 is shown in a timing chart of FIG. 5. A signal B is inputted into the bit line 1 at an instant t1, a signal W into the word line 4 at an instant t2, and a signal L1 into the line 9 at an instant t3. Although the signals to be inputted at the instants t1, t2, t3 may be inputted in the order shown in FIG. 5 if there are time differences among these instants, they may be inputted simultaneously. If there are time differences among the time of termination t4, t5, t6 of these signals B, W, L1, the signals terminate in the order shown in FIG. 5. They may also terminate at the same time. A voltage Vc1 appearing between the upper and lower electrodes of the capacitor 2 composed of a paraelectric substance, due to the signals B, W, L1, is developed by the charge which has been stored in the capacitor 2 during the time T2. A voltage Vc2 between the upper and lower electrodes of the capacitor 6 comprised of a ferroelectric substance is developed by the charge which has been stored in the capacitor 6 during the time T1 between the instants t3, t4. Since the capacitor 6 comprises a ferroelectric substance, which is reversely polarized during the time T1, the information at the instant t4 is retained even when the power source is cut off after the instant t4. During this time, it is necessary that the line 5 and 7 be grounded. FIG. 6 is a timing chart for an operation for reading information out of the nonvolatile cell unit 12 to the DRAM cell unit 11. An operation for reading information out of the nonvolatile cell unit 12 is carried out by inputting a signal L1 into the line 9 at an instant s1, and a signal L2 into the line 7 at an instant s2, under the condition (after an instant t6 in FIG. 5) in which information has been written nonvolatilely in the nonvolatile cell unit 12. If there is a time difference between the instants s1, s2 in this case, the inputting of the signals L1, L2 is done in the order shown in FIG. 6. These signals L1, L2 may also be inputted at the same instant. If there is a time difference between instants s3, s4 at which the signals L1, L2 are to terminate, these signals terminate in the order shown in FIG. 6. These signals may also terminate at the same instant. Due to the signals L1, L2, the capacitor 6 is reversely polarized and discharged during the time S1 which is between the instants s2, s3. In the meantime, the capacitor 2 connected to the capacitor 6 through the transistor 8 is charged during the time S1, and the information in the DRAM cell unit 11 lost after an operation for storing revives. During this time, it is necessary that the transistor 3 be off and the line 5 be grounded. The line 5 stabilizes the voltage of one electrode of capacitor 2 at store and readout in the DRAM cell unit 11. The line 7 stabilizes the voltage of one electrode of capacitor 6 at store and readout in the nonvolatile cell unit 12. The line 9 selects the nonvolatile cell unit 12. The bit line 1 stores information in the DRAM cell unit 11 and the nonvolatile cell unit 12, and reads out of the DRAM cell unit 11 and the nonvolatile cell unit 12. The word line 4 selects the DRAM cell unit 11.

According to the present invention described above, a volatile DRAM can be used as a nonvolatile memory owing to the additionally provided one transistor and one capacitor of a ferroelectric substance. This enables a semiconductor integrated circuit of a higher density to be produced.

Figure 2:
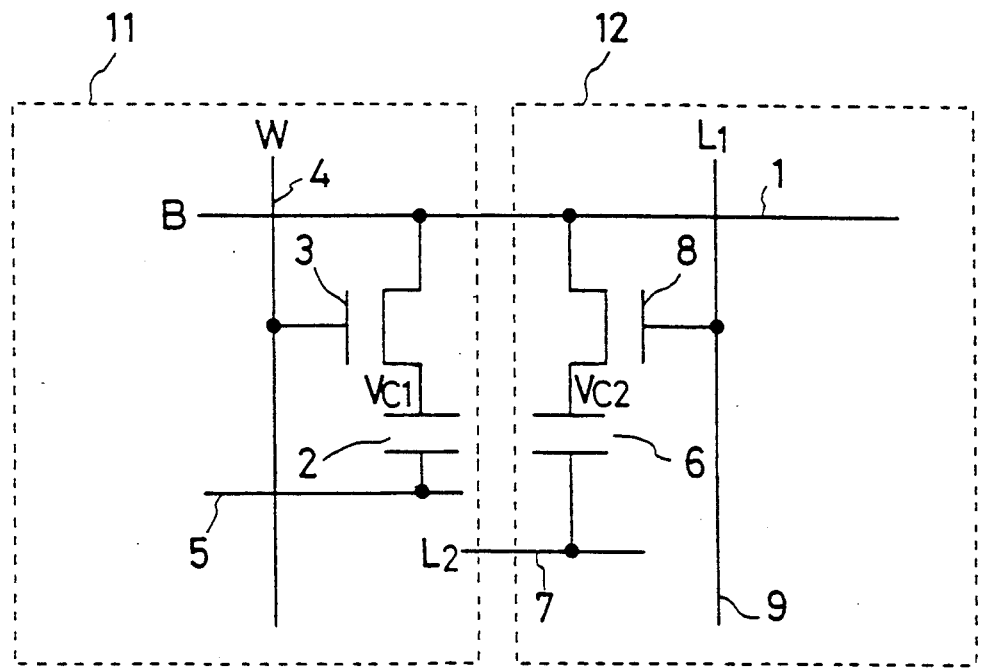
FIG. 2 is a diagram of a second embodiment of the semiconductor integrated circuit having a DRAM cell unit and a nonvolatile cell unit according to the present invention.
Figure 3:
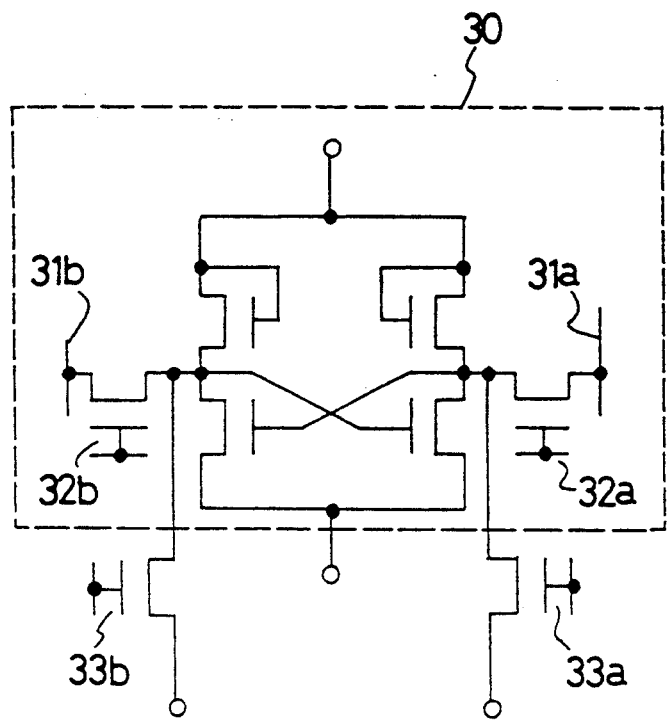
FIG. 3 is a circuit diagram of one type conventional nonvolatile RAM.
Figure 4:
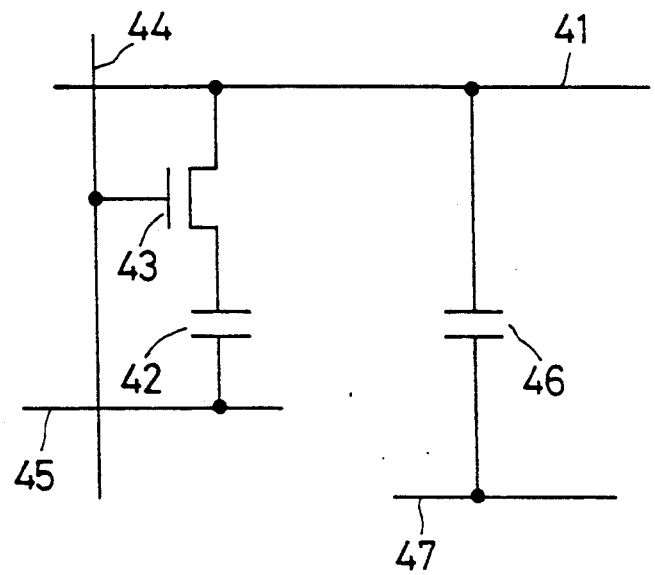
FIG. 4 is a circuit diagram of a second type of conventional nonvolatile DRAM.
Figure 7:
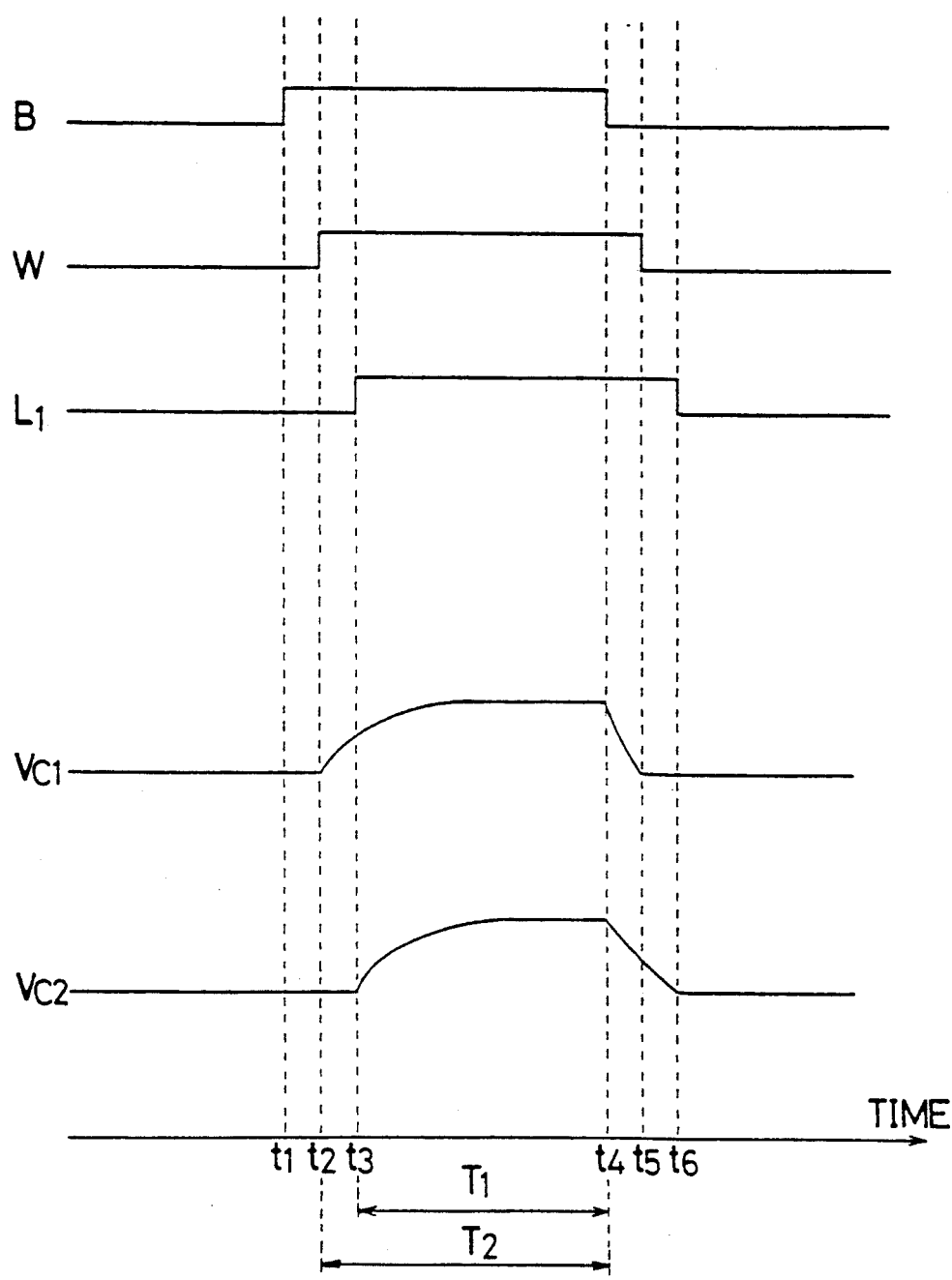
FIG. 7 is a timing chart for an operation for storing information in the DRAM cell unit and the nonvolatile cell unit shown in FIG. 2.
Figure 8:
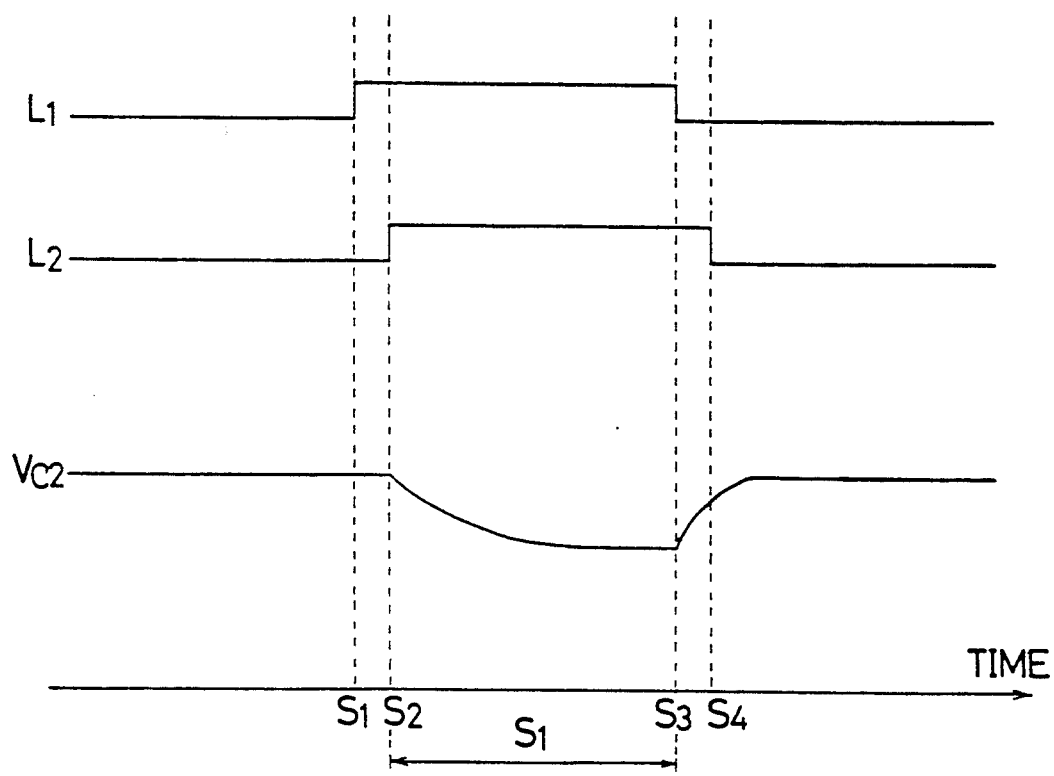
FIG. 8 is a timing chart for an operation of reading information out of the nonvolatile cell unit to the bit line shown in FIG. 2.

FIG. 2 is a diagram of one bit of the semiconductor integrated circuit according to a second embodiment of the present invention. The source electrode of a transistor 3 is connected to a bit line 1, the gate electrode thereof to a word line 4, and the drain electrode thereof to an upper electrode of a capacitor 2 consisting of a paraelectric substance, and a lower electrode of the capacitor 2 to a line 5. The bit line 1 and the source electrode of a transistor 8 are connected together, a gate electrode of the transistor 8 is connected to a line 9, and the drain electrode of the transistor 8 is connected to an upper electrode of a capacitor 6 comprising a ferroelectric substance. A lower electrode of the capacitor 6 is connected to a line 7. A combination of the bit line 1, word line 4, line 5, transistor 3 and capacitor 2 will hereinafter be called a DRAM cell unit 11, and a combination of the line 9, line 7, transistor 8 and capacitor 6 a nonvolatile cell unit 12, for convenience's sake. When the semiconductor integrated circuit according to the present invention is used as a volatile memory, the transistor 8 is off, and the DRAM cell unit 11 and nonvolatile cell unit 12 are electrically separated from each other, so that an operation of the DRAM only is carried out. An operation for storing the information in the DRAM cell unit 11 and the nonvolatile cell unit 12 is shown in a timing chart of FIG. 7. A signal B is inputted into the bit line 1 at an instant t1, a signal W into the word line 4 at an instant t2, and a signal L1 into the line 9 at an instant t3. Although the signals to be inputted at the instants t1, t2, t3 may be inputted in the order shown in FIG. 7 if there are time differences among these instants, they may also be inputted simultaneously. If there are time differences among the time termination t4, t5, t6 of these signals B, W, L1, the signals may terminate in the order shown in FIG. 7. A voltage Vc1 appearing between the upper and lower electrodes of the capacitor 2 composed of a paraelectric substance, due to the signals B, W, L1, is developed by the charge which has been stored in the capacitor 2 during the time T2. A voltage Vc2 appearing between the upper and lower electrodes of the capacitor 6 comprised of a ferroelectric substance is developed by the charge which has been stored in the capacitor 6 during the time T1 between the instants t3, t4. Since the capacitor 6 comprises a ferroelectric substance, which is reversely polarized during the time T1, the information at the instant t4 is retained even when the power source is cut off after the instant t4. During this time, it is necessary that the line 5 and 7 be grounded. FIG. 8 is a timing chart for an operation for reading information out of the nonvolatile cell unit 12 to the bit line 1. An operation for reading information out of the nonvolatile cell unit 12 is carried out by inputting a signal L1 into the line 9 at an instant s1, and a signal L2 into the line 7 at an instant s2, under a condition (after an instant t6 in FIG. 7) in which information has been written nonvolatilely in the nonvolatile cell unit 12. If there is a time difference between the instants s1, s2 in this case, the inputting of the signals L1, L2 is done in the order shown in FIG. 8. These signals L1, L2 may also be inputted at the same instant. If there is a time difference between instants s3, s4 at which the signals L1, L2 are to terminate, these signals terminate in the order shown in FIG. 8. These signals may also terminate at the same instant. Due to the signals L1, L2, the capacitor 6 is reversely polarized and discharged during the time S1 which is between the instants s2, s3. Accordingly, the information stored in the nonvolatile cell unit 12 appears on the bit line 1. During this time, it is necessary that the transistor 3 be off.

According to the present invention described above, a volatile DRAM can be used as a nonvolatile memory by merely adding one transistor and one capacitor of a ferroelectric substance to the DRAM. This enables a nonvolatile semiconductor integrated circuit of a higher density to be produced.

What is claimed is:

1. A semiconductor integrated circuit, comprising:
    a first transistor having a first gate electrode, first drain electrode and first source electrode, the first transistor being connected to a bit line at one of the first drain and first source electrodes;
    a first capacitor comprising a paraelectric substance, the first capacitor having first and second electrodes, one of the first and second electrodes of the first capacitor being connected to the other one of the first drain and first source electrodes which is not connected to the bit line;
    a first line connected to the other one of the first and second electrodes of the first capacitor which is not connected to the first transistor;
    a word line connected to the first gate electrode of the first transistor;
    a second transistor having a second gate electrode, second drain electrode and second source electrode, the second transistor being connected to the bit line at one of the second source and second drain electrodes;
    a second capacitor comprising a ferroelectric substance, the second capacitor having first and second electrodes, one of the first and second electrodes of the second capacitor being connected to the other one of the second source and second drain electrodes of the second transistor which is not connected to the bit line;
    a second line connected to the second gate electrode of the second transistor; and
    a third line connected to the other one of the first and second electrodes of the second capacitor which is not connected to the second transistor.

2. A semiconductor integrated circuit, comprising:
    a first transistor having a first gate electrode, first drain electrode and first source electrode, the first source electrode being connected to a bit line;
    a first capacitor comprising a paraelectric substance, the first capacitor having first and second electrodes, the first electrode of the first capacitor being connected to the first drain electrode;
    a first line connected to the second electrode of the first capacitor;
    a word line connected to the first gate electrode;
    a second transistor having a second gate electrode, second drain electrode and second source electrode, the second source electrode being connected to the bit line;
    a second capacitor comprising a ferroelectric substance, the second capacitor having first and second electrodes, the first electrode of the second capacitor being connected to the second drain electrode;
    a second line connected to the second gate electrode; and
    a third line connected to the second electrode of the second capacitor.

3. A semiconductor integrated circuit, comprising:
    a DRAM cell unit comprising a first transistor having gate, drain and source electrodes, a bit line connected to one of the drain and source electrodes of the first transistor, a first capacitor comprising a paraelectric substance and having first and second electrodes, the first electrode of the first capacitor being connected to the other of the drain and source electrodes of the first transistor which is not connected to the bit line, a first line connected to the second electrode of the first capacitor, and a word line connected to the gate electrode of the first transistor; and
    a nonvolatile cell unit comprising a second transistor having gate, drain and source electrodes, one of the drain and source electrodes of the second transistor being connected to the bit line, a second capacitor comprising a ferroelectric substance and having first and second electrodes, the first electrode of the second capacitor being connected to the other of the drain and source electrodes of the second transistor which is not connected to the bit line, a second line connected to the gate electrode of the second transistor, and a third line connected to the second electrode of the second capacitor.

4. A semiconductor integrated circuit according to claim 3; wherein the bit line is connected to the source electrode of the first transistor, and the first electrode of the first capacitor is connected to the drain electrode of the first transistor.

5. A semiconductor integrated circuit according to claim 3, wherein the bit line is connected to the drain electrode of the first transistor, and the first electrode of the first capacitor is connected to the source electrode of the first transistor.

6. A semiconductor integrated circuit according to claim 3; wherein the bit line is connected to the source electrode of the second transistor, and the first electrode of the second capacitor is connected to the drain electrode of the second transistor.

7. A semiconductor integrated circuit according to claim 3; wherein the bit line is connected to the drain electrode of the second transistor, and the first electrode of the second capacitor is connected to the source electrode of the first transistor.

8. A semiconductor integrated circuit according to claim 3; wherein the second capacitor is operable to store a charge from a time at which a signal inputted to the second line is commenced to a time at which a signal inputted to the bit line is terminated.

9. A semiconductor integrated circuit according to claim 8; wherein the first and third lines are grounded.

* * * * *